R.F. ATTENUATOR WITH ELECTRONIC SWITCHING
Filed Feb. 7, 1966
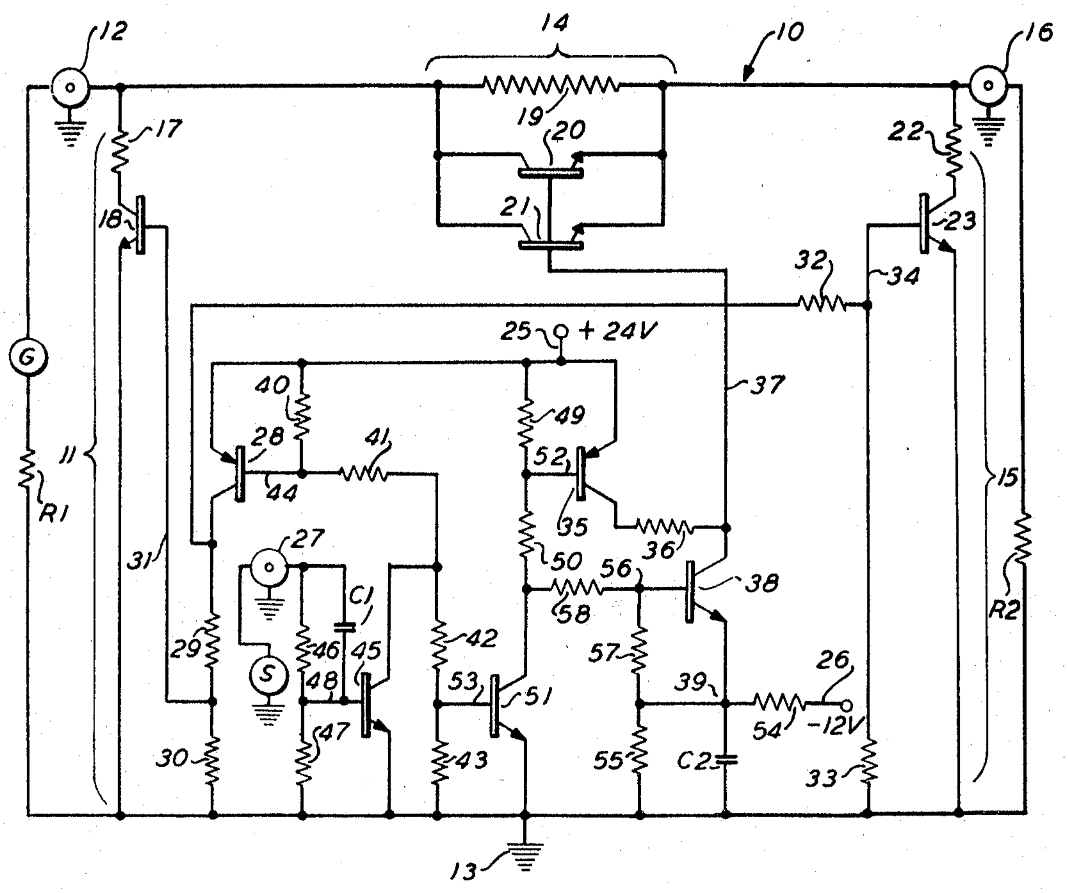
INVENTORS
ALFRED J. ROBINSON
WALTER A. FOX
BY George H. Fritzinger
AGENT 3,464,036

R.F. ATTENUATOR WITH ELECTRONIC SWITCHING

Alfred J. Robinson, New Providence, and Walter A. Fox, Pompton Lakes, N.J., assignors to McGraw-Edison Company, Elgin, Ill., a corporation of Delaware Filed Feb. 7, 1966, Ser. No. 525,733
Int. Cl. H01p *1/22*
U.S. Cl. 333—81 8 Claims

ABSTRACT OF THE DISCLOSURE

An R.F. attenuator is provided which has an electronic switching circuit enabling the attenuator to be switched "on" and "off" at a very fast rate. The attenuator is operable in a frequency range up to 100 megacycles and is designed to match specific input and output impedances with close tolerances through this frequency range in both its "on" and "off" conditions.

R.F. attenuators designed to match specific input and output impedances and to maintain close tolerances have been heretofore switched "on" and "off" by low resistance mechanical switches operated either by hand, step motors or relays of the standard or Reed type. Although such mechanical switches have the required low resistance in the milliohm range, they require time periods in the millisecond range to operate—width is too slow for many present-day applications.

Diodes and transistors have heretofore been used in R.F. attenuators for fast switching, but they have introduced problems because they have resistances typically from 1 to 20 ohms and capacitive reactances of appreciable magnitude at radio frequencies. In the prior R.F. attenuators provided with electronic switching devices no attempts have been made to match the input and output impedances. Also, the operating frequency range of these prior attenuators has extended from the lower frequencies to a maximum no greater than around 20 megacycles. Tolerances when specified have been 10% and greater.

Objects and features of the present invention are to provide an R.F. attenuator which can match specific input and output impedances, which can be switched at a fast rate into "on" and "off" conditions within less than 500 nanoseconds, which is operative over a frequency range up to 100 megacycles and which will maintain close tolerances.

Another object is to provide an attenuator with an electronic switching circuit which maintains a close input and output impedance matching both when the attenuator is in "on" and "off" conditions.

The present invention is herein described in connection with a Pi type attenuator but without intending any unnecessary limitation thereto. Briefly, the invention is carried out by adding low capacitance switching transistors in series with the shunt-arm resistors and by adding such transistors in parallel with the series-arm resistor. The shunt-arm transistors are operated at predetermined base currents in their "on" or conductive conditions so that their collector-emitter impedances are low values of essentially pure resistance. The series-arm transistors are provided with saturating base currents in their "on" condition so that they have the minimum possible collector-emitter impedances. The resistance value for each of the shunt-arms and the resistance value for the series-arm are calibrated by standard procedure for any given attenuation and any given input and output impedance. Since the switching transistors have a low finite resistance when in their "on" or conductive conditions, and a relatively high but not infinite resistance when in their "off" or non-conductive condition, it will be understood that in designing the attenuator, the resistance values of the transistors must be taken into account in determining the values of the resistors in these respective arms so that the impedances of the shunt and series arms of the attenuator are at the calculated values to provide the attenuator with the specified attenuation and specified input and output impedances. This results in a small insertion loss when the shunt-arm transistors are shifted to "off" condition and the series-arm transistors are shifted to "on" condition to place the attenuator in its "off" condition. An electronic circuit is provided which is shiftable to place the shunt-arm transistors in "on" condition and simultaneously the series-arm transistors in "off" condition whereby to place the attenuator in "on" condition, and is shiftable to place the shunt arm transistors in "off" condition and simultaneously the series-arm transistors in "on" condition whereby to place the attenuator in "off" condition with a small insertion loss.

These and other objects and features of the invention will be apparent from the following description and the appended claims.

In the following description reference is had to the accompanying drawing showing a schematic layout of an attenuator embodying our invention.

The attenuator 10 shown in the accompanying drawing is of the Pi type comprising an input shunt-arm 11 connected between an input terminal 12 and a ground 13, a series-arm 14, and an output shunt arm 15 connected between an output terminal 16 and ground 13. A generator G having an internal resistance R1 is connected to the input of the attenuator and a load resistance R2 is connected to the output thereof.

The input shun-arm 11 comprises a resistor 17 connected in series with a transistor 18 of, for example, the NPN type. The series-arm comprises a resistor 19 connected in parallel with transistors 20 and 21 also of the NPN type, two being shown by way of preferred example. Preferably, the transistor 18 is connected with grounded emitter and the transistors 20 and 21 have their emitters connected to the output terminal of the attenuator to obtain greater signal handling capability. The output shunt arm comprises a resistor 22 connected in series with a grounded-emitter transistor 23 also, for example, of the NPN type. The respective impedances of the shunt and series arms are calculated by formulae for given input and output impedances and a given attenuation. The values of the resistors 17 and 22 are then reduced from the calculated values of the respective shunt arms by the resistances of the respective transistors 18 and 23 when these transistors are in their specified "on" conditions. Likewise, the value of the resistor 19 is increased above the calculated value of the series arm of the attenuator by the shunt effect of the transistors 20 and 21 when these transistors are in their "off" conditions. As will appear, a feature of the invention is in maintaining the impedances of the shunt and series arms closely to their calculated values throughout the operating frequency range of the attenuator. This requires the use of transistors and resistors having good frequency characteristics with a minimum of capacitive and of inductive reactance.

The transistors 18, 20, 21 and 23, being of the NPN type, become conductive—i.e., reach their "on" conditions—when their base elements are made positive relative to the respective emitters. Before the shunt arm transistors 18 and 23 are installed they are tested at a frequency in the desired operating range to determine their base currents at which their impedances are essentially pure resistance. It may be noted that a too small base current will introduce a component of capacitive reactance and that a too high base current will introduce an inductive reactance. The selected operating condition for these shunt-arm transistors need not however be one wherein the internal resistance is a minimum since this resistance is compensated for by reducing the associated resistors 17 and 22 by the resistance values of the respective transistors. However, in order to obtain satisfactory operation up to 100 megacycles the output capacitances of the transistors 18 and 23 cannot be above two picofarads. It has been found that transistors type 2N3287 meet these requirements.

The series-arm transistors 20 and 21 need not be separately tested before they are connected in circuit since these transistors are to have the minimum possible impedances in their "on" condition obtained by supplying the transistors with a saturating level of base current. The series-arm transistors must however have both very low input capacitance and very low output capacitance each not substantially in excess of .7 picofarad for if the output capacitance is high the attenuation is not retained over the whole frequency range and if the input capacitance is high the input impedance of the attenuator will fall off over the operating frequency range. It has been found that transistors type 2N3493 meet these requirements. Both of the transistors types 2N3287 and 2N3493 can be selected to have approximately 6 ohms resistance when in their "on" conditions. Typically, these transistors have about 10,000 ohms resistance when in their "off" conditions.

An electronic switching circuit is provided which when in "on" condition supplies the shun-arm transistors 18 and 23 with the necessary base currents above-described and simultaneously the series-arm transistors with a zero base current, and which when in "off" condition cuts off the base currents to the shunt-arm transistors and supplies simultaneously saturating base currents to the series-arm transistors. This switching circuit is operated from a positive D.C. voltage source 25 typically of 24 volts and a negative D.C. voltage source 26 typically of 12 volts, and is controlled by a programs voltage typically of about two volts positive obtained from any suitable source S connected between a control terminal 27 and ground. A voltage divider circuit is provided from the plus terminal 25 to ground 13 via a transistor 28, resistor 29 and resistor 30. A lead line 31 runs from the junction between resistors 29 and 30 to supply the required base current to the shunt-arm transistor 18 to place this transistor in "on" condition. Another voltage divider circuit runs from the plus terminal 25 to ground 13 through the transistor 28, resistor 32 and resistor 33. A lead line 34 runs from the junction between resistors 32 and 33 to supply the required base current to the shunt-arm transistor 23 to place this transistor in "on" condition. The transistor 28 is, for example, of the PNP type which reaches its "on" or conductive condition when the base is more negative than the emitter. A circuit for supplying saturating base currents to the series-arm transistors 20 and 21 runs from the plus terminal 25 through transistor 35 also of the PNP type, resistor 36, lead line 37, base-emitters of the series-arm transistors in parallel, and the output load resistor R2 to ground 13.

A voltage divider circuit for controlling the "on" and "off" conditions of the transistor 28 runs from the plus terminal 25 through resistors 40, 41, 42 and 43 to ground 13. A lead connection 44 is made from the junction between resistors 40 and 41 to the base of transistor 28. Resistors 42 and 43 are shunted by a transistor 45 of, for example, the NPN type. When the transistor 45 is "off" the bias voltage to the transistor 28 is reduced to place this transistor in "off" condition. The transistor 45 is controlled by the program source S through a circuit comprising a resistor 46 and capacitor $C_1$ in parallel between the control terminal 27 and base of the transistor, and a resistor 47 connected between the base and ground 13. The capacitor $C_1$ is provided to speed up the application of the program voltage to the transistor 45. When there is no program voltage the transistor 45 receives no base current and is held in "off" condition. Since the transistor 28 is then also in "off" condition there is no bias current supplied to the shunt-arm transistors 18 and 23 to place these transistors in "on" condition. The shunt arms of the attenuator are therefore then of such high impedance as to be effectively out of circuit to place the attenuator in "off" condition as far as the shunt arms are concerned.

A base control circuit for the transistor 35 runs from the plus terminal 25 to ground 13 through resistors 49 and 50 and a transistor 51 of, for example, the NPN type. A lead 52 connects the junction between resistors 49 and 50 to the base of the transistor 35. Also, a lead 53 runs from the junction between the resistors 42 and 43 to the base of the transistor 51. When the transistor 45 is "off" because of a lack of program voltage, a base current is fed to the transistor 51 to place it in "on" condition. A current then flows through resistors 49 and 50 and the transistor 51 to supply base current to the transistor 35 to place it in "on" condition. The current then flows from the plus terminal 25 through the transistor 35, resistor 36, base-emitter circuits of the series-arm transistors 20 and 21 and load R2 to provide the series-arm transistors with sufficient base current to place them in a saturated "on" condition—which is the condition for placing the attenuator in "off" condition as far as the series arm is concerned. Accordingly, when there is no program voltage supplied to the control terminal 27, both the shunt and series arms of the attenuator are in their respective conditions for placing the attenuator in "off" condition.

Although a transistor 38 of, for example, the NPN type leads off from the junction between the resistor 36 and the base elements of the series-arm transistors 20 and 21, this transistor is in "off" condition when the transistor 51 is in "on" condition. This is because the emitter of this transistor stands 4 volts negative by being connected to the junction 39 of voltage divider resistors 54 and 55 connected across the negative 12 volts source 26 to ground 13, and the base of transistor 38 is equal in voltage or slightly positive relative to the emitter when the transistor 51 is "on" by being connected to a junction 56 of a voltage divider running from the junction 39 to ground 13 via the resistors 57 and 58 and the transistor 51. A small leakage current will bleed off from the base circuit to the series-arm transistors 20 and 21 when there is a zero program voltage, but this is insufficient to effect the "on" condition of the series-arm transistors. As will appear, the transistor 38 and its bias network is provided to supply a negative voltage for drawing off quickly the charge on the base elements of the series-arm transistors when the attenuator is switched to "on" condition.

When a program voltage of approximately 2 volts positive is applied to the control terminal 27 a base voltage is supplied to the transistor 45 to place it in "on" condition. The transistor 45 then shunts the resistors 42 and 43 to cut off the base voltage to the transistor 51 to turn off this transistor; also, by shorting the resistors 42 and 43, the current through the resistors 40 and 41 is increased to make the base element of the transistor 28 sufficiently negative to turn it on. When the transistor 28 is "on" the current flows through resistors 29 and 30 to supply a base current to the transistor 18 to turn it "on" and through resistors 32 and 33 to supply a base current to the transistor 23 to turn it on. In this connection resistors 29 and 32 are current limiters to cause the transistors 18 and 23 to be supplied with the desired base currents to cause these transistors to have essentially pure resistances. The resistors 30 and 33 provide low impedance paths for the removal of the storage charges on the transistors 18 and 23 to speed up the switching to "on" condition.

Further, when the transistor 51 is turned off the previous short across the resistors 55, 57 and 58 is removed, causing an increase in the flow current in the resistor 57 from the plus terminal 25 to provide the transistor 38 with a positive bias sufficient to turn it on. This applies the negative 4 volts on the junction 39 to the bases of the series-arm transistors 20 and 21. At the same time, the introduction of resistors 55, 57 and 58 in series with the resistors 50 and 49 reduces the current flow so that the negative bias to the base of the transistor 35 is reduced to turn the transistor off. This cuts off the base current to the series-arm transistors to place these transistors in "off" condition. Since the negative 4 volts from the junction 39 is applied to the series-arm transistors via the transistor 38 the instant the bias current is cut off the storage charge on the bases of the series-arm transistors is removed quickly to reduce the switching time. Since the series-arm transistors are now turned off and the shunt-arm transistors are turned on, the attenuator is placed in "on" condition.

When the attenuators is in "off" condition, the series transistors 20 and 21—which are then in "on" condition—form effectively a T network of very low attenuation since the connection of the lead 37 to the base of each transistor is at the approximate midpoint of the transistor. In this T network the impedance from the base lead 37 to the collectors of the transistors 20 and 21 form the input arm series resistance as modified by the bridging resistor 19, the impedance from the base lead connection 37 to the emitters of the transistors 20 and 21 forms the output arm series resistance as modified by the bridging resistor 19, and the base current limiting resistor 36 and series resistance of the switching transistor 35 in the circuit to the terminal 25 at R.F. ground forms the center shunt arm resistance of the network. By way of example, in an attenuator designed to have 15 db attentuation and input and output impedances of 75 ohms in both its "on" and "off" conditions, the value of the resistors 17 and 22 is 61.53 ohms each, of resistor 19 is 148.28 ohms and of resistor 36 is 910 ohms.

Typical values of resistors for the switching circuit are as follows: resistor 30, 47 ohms; resistor 33, 47 ohms; resistor 40, 160 ohms; resistor 41, 3.6K; resistor 42, 7.5K; resistor 43, 750 ohms; resistor 46, 1.5K; resistor 47, 1.3K; resistor 49, 160 ohms; resistor 50, 3.6K; resistor 54, 750 ohms; resistor 55, 470 ohms; resistor 57, 470 ohms; and resistor 58, 9.1K. The values of the resistors 29 and 32 are determined by tests to establish the desired base currents to the shunt arm transistors.

The embodiment of our invention herein particularly shown and described is intended to be illustrative but not necessarily limitative of our invention since the same is subject to changes and modifications without departure from the scope of our invention, which we endeavor to express according to the following claims.

We claim:

1. A radio frequency attentuator capable of being switched "on" and "off" within 500 nanoseconds comprising a shunt arm and a series arm of respective predetermined impedance values to give the attenuator a predetermined attenuation and predetermined input and output impedances, said shunt arm comprising a resistor and an on-off transistor in series, said transistor having a low capacitance when in "off" condition and having in "on" condition an essentially pure resistance at a predetermined base current the sum of which resistance with that of the resistor in the respective shunt arm equals said predetermined value, said series arm including in parallel a resistor and an on-off transistor, said resistor and transistor of said series arm having an impedance when the transistor is in "off" condition equal to said predetermined impedance value and said transistor having a minimum impedance when saturated with base current, and electronic circuit switching means shiftable to an "on" condition for supplying said transistor of said shunt arm with said predetermined base current and for providing said transistor of said series arm with a zero base current, and shiftable to an "off" condition for cutting off the base current to the transistor of said shunt arm and for supplying the transistor of said series arm with said saturating base current whereby to shift said attenuator respectively to "on" and "off" conditions.

2. The attenuator set forth in claim 1 including one series arm and two shunt arms of the Pi type, wherein said circuit switching means is adapted for supplying different preselected base currents to the transistors in the shunt arms at the input and output ends of said attenuator.

3. The attenuator set forth in claim 1 wherein said series arm includes two transistors in parallel with said series resistor, said two transistors having a common base circuit controlled by said circuit switching means.

4. The attenuator set forth in claim 1 wherein said circuit switching means is connected permanently to a D.C. supply voltage and includes a terminal for connection to a D.C. program voltage for shifting the attenuator between "on" and "off" conditions.

5. The attenuator set forth in claim 1 wherein said circuit switching means includes means to supply a negative voltage to the base of said series arm transistor whereby to speed up the removal of the storage charge from said base when said attenuator is shifted from "off" to "on" conditions.

6. The attenuator set forth in claim 1 wherein said circuit switching means includes means responsive to a program control voltage to shift said attenuator to "on" and "off" conditions as said program control voltage is turned "on" and "off."

7. The attenuator set forth in claim 1 wherein said series-arm transistor and the base current circuit therefor form a T network when the attenuator is in "off" condition, including means in said base current circuit to cause the input and output impedance of said attenuator to be substantially the same when the attenuator is in "off" condition as when the attenuator is in "on" condition.

8. The attenuator set forth in claim 1 wherein the transistor in said shunt arm is connected with grounded emitter, and the transistor of said series arm has its emitter connected to the output of the attenuator.

References Cited

UNITED STATES PATENTS

| | | | |
|---|---|---|---|
| 2,182,329 | 12/1939 | Wheeler | 330—144 X |
| 2,782,307 | 2/1957 | Sivers et al. | 333—81 X |
| 2,946,969 | 7/1960 | Rosen | 333—81 X |
| 2,969,457 | 1/1961 | Felix et al. | 333—18 X |
| 3,218,570 | 11/1965 | Godier | 330—144 X |
| 3,325,754 | 6/1967 | Frisch et al. | 333—81 |

HERMAN K. SAALBACH, Primary Examiner

WM. H. PUNTER, Assistant Examiner

U.S. Cl. X.R.

323—016; 333—017